United States Patent
Schroder et al.

(10) Patent No.: US 9,095,874 B2
(45) Date of Patent: Aug. 4, 2015

(54) METHOD AND APPARATUS FOR CURING THIN FILMS ON LOW-TEMPERATURE SUBSTRATES AT HIGH SPEEDS

(71) Applicant: NCC NANO, LLC, Dallas, TX (US)

(72) Inventors: Kurt A Schroder, Coupland, TX (US); Karl M Martin, Austin, TX (US); Doug K. Jackson, Austin, TX (US); Steven C McCool, Austin, TX (US)

(73) Assignee: NCC NANO, LLC, Dallas, TX (US)

( * ) Notice: Subject to any disclaimer, the term of this patent is extended or adjusted under 35 U.S.C. 154(b) by 0 days.

(21) Appl. No.: 14/171,298

(22) Filed: Feb. 3, 2014

(65) Prior Publication Data
US 2014/0145092 A1    May 29, 2014

Related U.S. Application Data

(63) Continuation of application No. 12/253,399, filed on Oct. 17, 2008, now Pat. No. 8,410,712, and a continuation of application No. 13/771,343, filed on Feb. 20, 2013, now Pat. No. 8,674,618.

(60) Provisional application No. 61/079,339, filed on Jul. 9, 2008.

(51) Int. Cl.
| H05B 41/14 | (2006.01) |
| B05D 3/06 | (2006.01) |
| F26B 3/34 | (2006.01) |
| H05B 41/34 | (2006.01) |
| H05K 3/12 | (2006.01) |
| H05K 1/09 | (2006.01) |

(52) U.S. Cl.
CPC . *B05D 3/06* (2013.01); *F26B 3/343* (2013.01); *H05B 41/34* (2013.01); *H05K 3/1283* (2013.01); *H05K 1/095* (2013.01); *H05K 2203/1545* (2013.01)

(58) Field of Classification Search
USPC ............... 315/246, 291, 200 A, 241 P, 241 S; 356/301, 317; 445/28; 427/492, 554; 250/492.1, 492.2, 492.21, 492.22, 250/492.23, 493.1, 504 R
See application file for complete search history.

(56) References Cited

U.S. PATENT DOCUMENTS 8,410,712 B2 *  4/2013  Schroder et al. ........... 315/241 P
8,674,618 B2 *  3/2014  Shroder et al. ............. 315/241 P

* cited by examiner

*Primary Examiner* — Nicole Ippolito
(74) *Attorney, Agent, or Firm* — Anthony P. Ng; Russell Ng PLLC

(57) ABSTRACT

A curing apparatus for thermally processing thin films on low-temperature substrates at high speeds is disclosed. The curing apparatus includes a strobe head, a strobe control module and a conveyor control module. The strobe control module controls the power, duration and repetition rate of a set of pulses generated by a flash lamp on the strobe head. The conveyor control module along with the strobe control module provide real-time synchronization between the repetition rate of the set of pulses and the speed at which the substrate is being moved under the strobe head, according to the speed information.

13 Claims, 3 Drawing Sheets

WEB DIRECTION

METHOD AND APPARATUS FOR CURING THIN FILMS ON LOW-TEMPERATURE SUBSTRATES AT HIGH SPEEDS

PRIORITY CLAIM

The present application claims priority under 35 U.S.C. §119(e)(1) to provisional application No. 61/079,339 filed on Jul. 9, 2008, the contents of which are incorporated herein by reference.

BACKGROUND OF THE INVENTION

1. Technical Field

The present invention relates to curing systems in general, and, in particular, to a method for curing thin films on substrates at low temperatures.

2. Description of Related Art

Printed electronics is the convergence of the semiconductor industry and the printing industry. The notion of printing electronic circuits instead of printing reading materials is seductive to printers as they can see the potential for doing "high value" print jobs without making major changes to their equipment. Similarly, electronic circuit manufacturers view the notion of printing electronic circuits as equally seductive because it allows them to fabricate electronic circuits in large volumes at a relatively low cost.

During the manufacturing of electronic circuits, most thin film coatings need to be thermally processed, and the effectiveness of most thermal curing processes is related to the product of temperature and time. For example, the typical approach to curing a thin film is placing the thin film in an oven set to the maximum working temperature of a substrate on which the thin film is disposed, and allowing the thin film to be cured within some reasonable amount of time.

Since printed electronic circuits are typically associated with high volume and low cost, the substrates for the printed electronic circuits need to be made of relatively cheap materials such as paper or polymer instead of traditional substrate materials such as silicon, quartz, glass, ceramic, FR4, etc. However, paper or polymer has a much lower temperature of decomposition than silicon, quartz, glass, ceramic, FR4, etc., and the much lower temperature necessitates a longer cure time for thin films. For example, the maximum working temperature of polyethylene terephthalate (PET) is 150° C., and a typical curing time for a silver based conductive film at this temperature is in the order of minutes. Such a long curing time makes the proposition of printing electronic circuits on paper on polymer much less economically attractive.

Consequently, it would be desirable to provide a method and apparatus for thermally processing thin films on low-temperature substrates at a relatively high speed.

SUMMARY OF THE INVENTION

In accordance with a preferred embodiment of the present invention, a curing apparatus includes a strobe head, a sensor, a strobe control module and a conveyor control module. The strobe control module controls the power, duration and repetition rate of a set of pulses generated by a flash lamp on the strobe head. The sensor senses the speed at which a substrate is being moved under the strobe head. The conveyor control module along with the strobe control module provide real-time synchronization between the repetition rate of the set of pulses and the speed at which the substrate is being moved under the strobe head, according to the speed information obtained by the sensor.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

For the present invention, curing is defined as thermal processing, which includes drying (driving off solvent), particle sintering, densification, chemical reaction initiation, phase transformation, grain growth, annealing, heat treating, etc. When curing materials on a low-temperature substrate, such as polymer or paper, one limiting factor in attaining a good cure is the decomposition of the substrate because a thin film (which is defined as a layer of material of less than 100 microns thick) often needs to be processed at temperatures close to or even beyond the decomposition temperature of the substrate. Furthermore, even if the thin films can be cured at a low temperature, the low decomposition temperature of the substrate increases the amount of time to thermally cure the material on the substrate. The above-mentioned problems can be overcome by the curing apparatus of the present invention.

Figure 1:
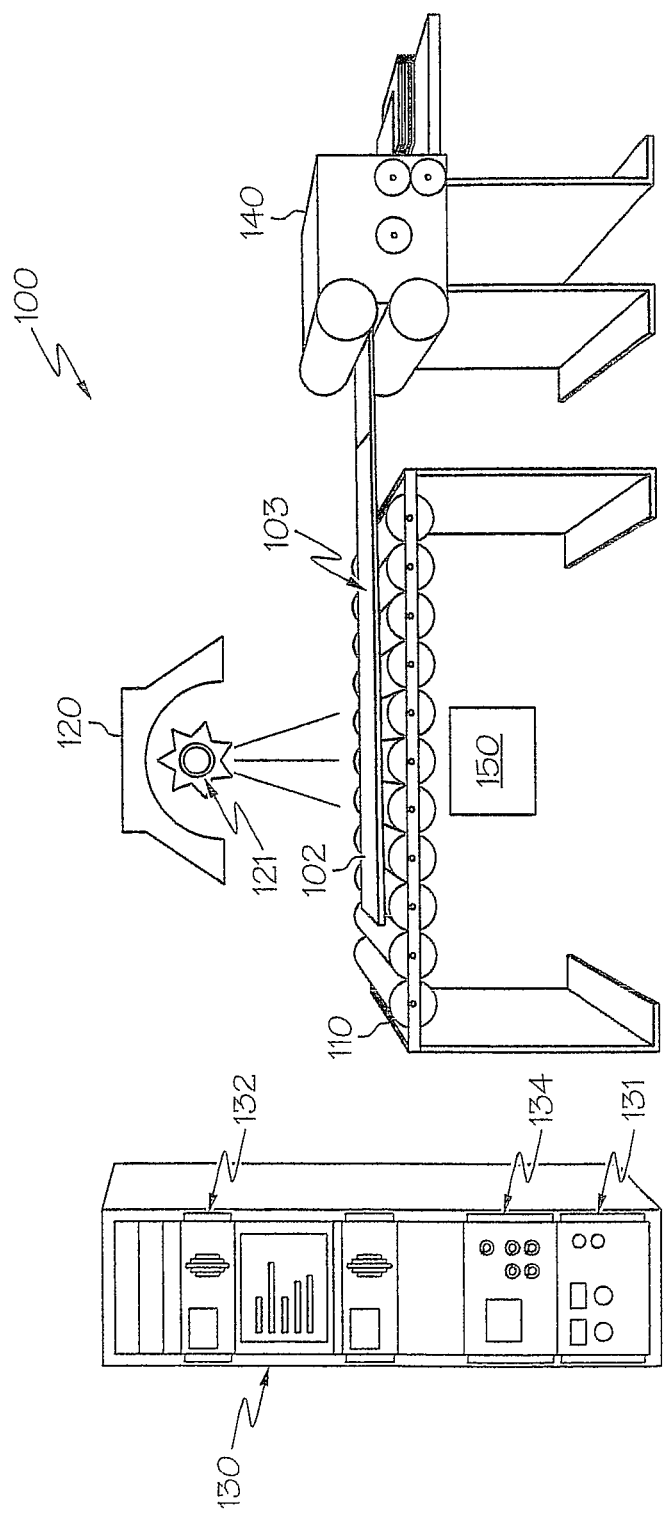
FIG. 1 is a diagram of a curing apparatus, in accordance with a preferred embodiment of the present invention.

Referring now to the drawings and in particular to FIG. 1, there is depicted a diagram of a curing apparatus, in accordance with a preferred embodiment of the present invention. As shown, a curing apparatus 100 includes a conveyor belt system 110, a strobe head 120, a relay rack 130 and a reel-to-reel feeding system 140. Curing apparatus 100 is capable of curing a thin film 102 mounted on a low-temperature substrate 103 situated on a web or individual sheets being moved across a conveyor belt at a relatively high speed. Conveyer belt system 110 can operate at speeds from 2 to 1000 ft/min, for example, to move substrate 103. Curing apparatus 100 can accommodate a web of any width in 6-inch increments. Thin film 102 can be added on substrate 103 by one or combinations of existing technologies such as screen printing, inkjet printing, gravure, laser printing, xerography, pad printing, painting, dip-pen, syringe, airbrush, flexographic, chemical vapor deposition (CVD), PECVD, evaporation, sputtering, etc.

Strobe head 120, which is preferably water cooled, includes a high-intensity pulsed xenon flash lamp 121 for curing thin film 102 located on substrate 103. Pulsed xenon flash lamp 121 can provide light pulses of different intensity, pulse length and pulse repetition frequency. For example, pulsed xenon flash lamp 121 can provide 10 µs to 10 ms pulses with a 3" by 6" wide beam pattern at a pulse repetition rate of up to 1 kHz. The spectral content of the emissions from pulsed xenon flash lamp 121 ranges from 200 nm to 2,500 nm. The spectrum can be adjusted by replacing the quartz lamp with a cerium doped quartz lamp to remove most of the emission below 350 nm. The quartz lamp can also be replaced with a sapphire lamp to extend the emission from approximately 140 nm to approximately 4,500 nm. Filters may also be added to remove other portions of the spectrum. Flash lamp 121 can also be a water wall flash lamp that is sometimes referred to as a Directed Plasma Arc (DPA) arc lamp.

Relay rack 130 includes an adjustable power supply 131, a conveyor control module 132, and a strobe control module 134. Adjustable power supply 131 can produce pulses with an energy of up to 4 kiloJoules per pulse. Adjustable power supply 131 is connected to pulsed xenon flash lamp 121, and the intensity of the emission from pulsed xenon flash lamp 121 can be varied by controlling the amount of current passing through pulsed xenon flash lamp 121.

Adjustable power supply 131 controls the emission intensity of pulsed xenon flash lamp 121. The power, pulse duration and pulse repetition frequency of the emission from pulsed xenon flash lamp 121 are electronically adjusted and synchronized to the web speed to allow optimum curing of thin film 102 without damaging substrate 103, depending on the optical, thermal and geometric properties of thin film 102 and substrate 103.

During curing operation, substrate 103 as well as thin film 102 are being moved onto conveyor belt system 110. Conveyor belt system 110 moves thin film 102 under strobe head 120 where thin film 102 is cured by rapid pulses from pulsed xenon flash lamp 121. The power, duration and repetition rate of the emissions from pulsed xenon flash lamp 121 are controlled by strobe control module 134, and the speed at which substrate 103 is being moved past strobe head 120 is determined by conveyor control module 132.

A sensor 150, which can be a mechanical, electrical or optical sensor, is utilized to sense the speed of the conveyor belt of conveyor belt system 110. For example, the conveyor belt speed of conveyor belt system 110 can be sensed by detecting a signal from a shaft encoder connected to a wheel that made contact with the moving conveyor belt. In turn, the pulse repetition rate can be synchronized with the conveyor belt speed of conveyor belt system 110 accordingly. The synchronization of the strobe pulse rate f is given by:

$$f = \frac{0.2 * S * O}{W}$$

where f=strobe pulse rate [Hz]
S=web speed [ft/min]
O=overlap factor (i.e., the average number of strobe pulses that are received by the substrate)
W=curing head width [in]

For example, with a web speed of 200 ft/min, an overlap factor of 5, and a curing head width of 2.75 inches, the pulse rate of the strobe lamp is 72.7 Hz.

By combining a rapid pulse train with moving substrate 103, a uniform cure can be attained over an arbitrarily large area as each section of thin film 102 is exposed to multiple pulses, which approximates a continuous curing system such as an oven.

When thin film 102 is in direct contact with substrate 103, its heating is limited by the decomposition temperature of substrate 103 at the interface of thin film 102. This effect can be alleviated and better curing can be attained by placing a layer of thermal barrier material with a higher temperature of decomposition than substrate 103 between thin film 102 and substrate 103.

Figure 2:
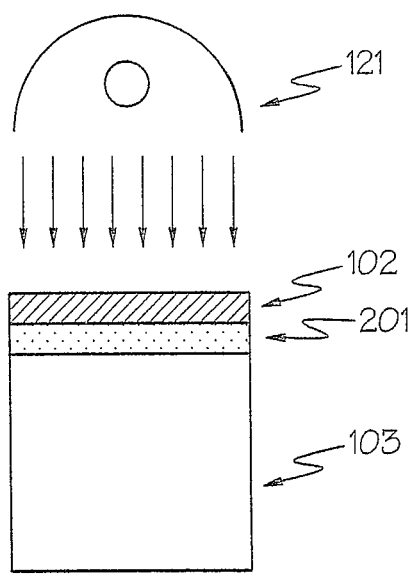
FIG. 2 is a diagram of a thermal barrier layer on a low-temperature substrate, in accordance with a preferred embodiment of the present invention.

With reference now to FIG. 2, there is depicted a diagram of a thermal barrier layer added onto a low-temperature substrate, in accordance with a preferred embodiment of the present invention. As shown, a thermal barrier layer 201 is inserted between thin film 102 and substrate 103. Thermal barrier layer 201 enables a higher power radiation pulse to more deeply cure thin film 102 on substrate 103 that is thermally fragile. The usage of thermal barrier layer 201 enables a higher power irradiation and a slightly higher total energy, which results in a pulse having a shorter pulse length. When multiple rapid pulses are used, the time scale of curing is increased to a level that allows heat to be removed from substrate 103 during the curing process.

Thermal barrier layer 201 is preferably a higher temperature material than substrate 103 yet with a lower thermal conductivity than substrate 103. Thermal barrier layer 201 can be made of, for example, a layer of silicon dioxide ($SiO_2$). Other materials include silica particles or ceramic particles. Silane derivatives make excellent high temperature binders for these particles. A particularly convenient barrier layer is spin-on-glass (SOG), which is widely used in the semiconductor industry for wafer planarization as it can easily be applied to a large area with standard coating techniques. SOG allows thermal barrier layer 201 to be applied in-line in a reel-to-reel process at a high processing rate.

Figure 3:
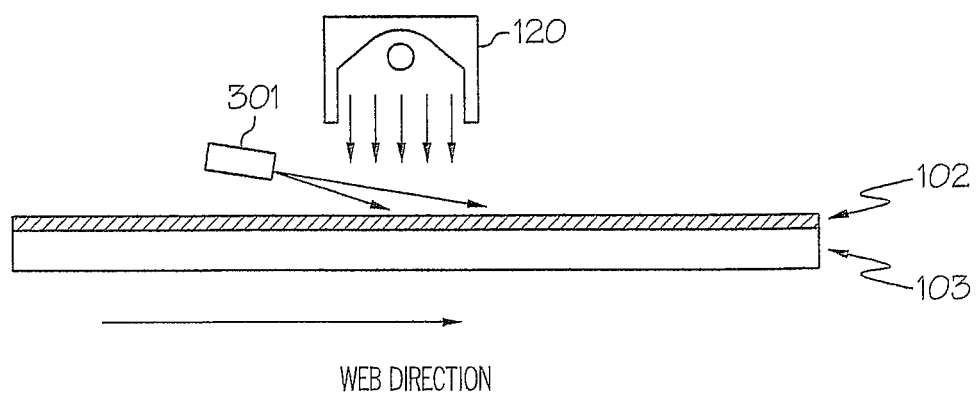
FIG. 3 is a diagram of an air knife within the curing apparatus from FIG. 1, in accordance with a preferred embodiment of the present invention.

Referring now to FIG. 3, there is depicted a diagram of an air knife within curing apparatus 100 from FIG. 1, in accordance with a preferred embodiment of the present invention. As shown, an air knife 301 is utilized to cool substrate 103 before, during, and/or after curing of thin film 102. Air knife 301 is applied from the top or bottom of substrate 103. When applied from the top, air knife 301 may also aid in removing additional solvent from thin film 102 during the curing process. Although there can be little convective cooling during a single pulse (~1 ms), this technique can provide substantive cooling during a rapid pulse train that may be greater than 100 ms.

Figure 4:
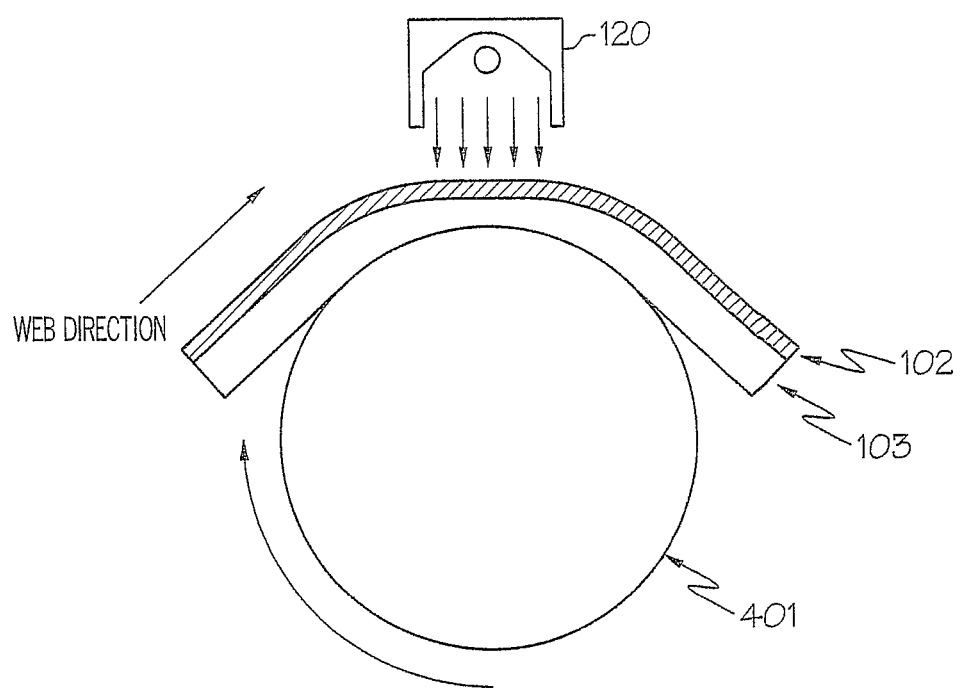
FIG. 4 is a diagram of a cooling roller within the curing apparatus from FIG. 1, in accordance with a preferred embodiment of the present invention.

With reference now to FIG. 4, there is depicted a diagram of a cooling roller within curing apparatus 100 from FIG. 1, in accordance with a preferred embodiment of the present invention. As shown, a cooling roller 401 is utilized to cool substrate 103. Substrate 103 is drawn over roller 401 before, during, or after the curing process. Roller 401 functions to remove heat via conduction from substrate 103 after the curing process. Active cooling may be applied to roller 401 in order to maintain roller 401 at a constant temperature. Aside from pre-cooling substrate 103, though there can be little external conductive cooling during a single pulse (~1 ms), this technique can provide additional substantive cooling during a rapid pulse train that may be greater than 100 ms.

As has been described, the present invention provides a curing apparatus and method for thermally processing thin films on low-temperature substrates at relatively high speeds.

The following is an example of curing using the curing apparatus of the present invention with a sheet fed conveyor. A silver nanoparticle, aqueous-based ink, which is available commercially from Novacentrix Corporation, was loaded into an ink jet cartridge and printed onto a photopaper at approximately 300 nm thick. After printing, the ink layer had a sheet resistance of approximately 20,000 ohm/square. The photopaper (i.e., substrate) was clamped onto a ¼" thick aluminum plate maintained at 27° C. and placed on a conveyor belt moving at 100 feet per minute. The curing region of the curing lamp was 2.75" wide in the web conveyance direction and 6" wide perpendicular to the web conveyance direction resulting in a beam area of 106 cm². The strobe lamp was activated to provide multiple pulses at a frequency of 14.6 Hz with a pulse width of 450 microseconds, delivering 1.0 J/cm² per pulse and an average radiant power of 2.2 KW/cm². Each portion of the substrate received 2 overlapping pulses for a total of 2.0 J/cm² of total energy. The total time of curing was approximately 0.15 seconds. After curing, the sheet resistance of the ink layer was reduced to 0.25 ohms per square. This corresponded to a resistivity of 8 micro-ohm-cm or five times the resistivity of bulk silver. The area of the ink layer was larger than the curing head, but the overlapping pulses resulting from the combination of rapid pulsing and a moving substrate allowed a uniform cure for an arbitrarily long pattern. In contrast, with conventional oven curing, an identical film/substrate can be placed in an oven at 100° C. (which is the highest working temperature of the substrate). After 30 minutes of curing, the resulting sheet resistance reached only 1.8 ohms/square.

While the invention has been particularly shown and described with reference to a preferred embodiment, it will be understood by those skilled in the art that various changes in form and detail may be made therein without departing from the spirit and scope of the invention.

What is claimed is:

1. A curing apparatus comprising:
    a strobe head having a flash lamp;
    a strobe control module for controlling power, duration and repetition rate of a plurality of pulses generated by said flash lamp; and
    a conveyor control module, in conjunction with said strobe control module, for synchronizing in real-time said repetition rate of said plurality of pulses with a speed at which said substrate is being moved under said strobe head, wherein said synchronization of a strobe pulse rate f is given by:

$$f = \frac{0.2 * S * O}{W}$$

where f=strobe pulse rate [Hz]
    S=speed at which said substrate is being moved [ft/min]
    O=an average number of strobe pulses received by said substrate
    W=strobe head width [in].

2. The curing apparatus of claim 1, wherein said flash lamp is a xenon flash lamp.

3. The curing apparatus of claim 2, wherein said xenon flash lamp is capable of generating pulses from 10 µs to 10 ms at a pulse repetition rate of up to 1 kHz.

4. The curing apparatus of claim 2, wherein the spectral content of said xenon flash lamp ranges from 200 nm to 2,500 nm.

5. The curing apparatus of claim 1, wherein said curing apparatus further includes an air knife for cooling said substrate.

6. The curing apparatus of claim 1, wherein said curing apparatus further includes a roller for removing heat from said substrate via conduction.

7. The curing apparatus of claim 1, wherein said flash lamp is a Directed Plasma Arc lamp.

8. The curing apparatus of claim 1, wherein said curing apparatus further includes a conveyor system for transporting said substrate under said strobe head.

9. The curing apparatus of claim 8, wherein said curing apparatus further includes a feeder for feeding said substrate to said conveyor system.

10. The curing apparatus of claim 1, wherein said curing apparatus further includes a sensor for sensing the speed at which a substrate is being moved under said strobe head.

11. A method for curing thin films on low-temperature substrates, said method comprising:
    generating a plurality of pulses via a flash lamp at a predetermined power, duration and repetition rate; and
    transporting a layer of substrate under said flash lamp such that a film located on said layer of substrate is cured by said plurality of pulses from said flash lamp, wherein said layer of substrate is moved at a speed that is synchronized with said repetition rate of said plurality of pulses, and said film is subjected to multiple exposures from said plurality of pulses, wherein said synchronization of a strobe pulse rate f is given by:

$$f = \frac{0.2 * S * O}{W}$$

where f=strobe pulse rate [Hz]
    S=speed at which said substrate is being moved [ft/min]
    O=an average number of strobe pulses received by said substrate
    W=strobe head width [in].

12. The method of claim 11, wherein said layer of substrate is conveyed by a reel-to-reel system.

13. The method of claim 11, wherein said method further includes inserting a thermal barrier layer between said film and said layer of substrate.

* * * * *